(12) United States Patent
Imanishi

(10) Patent No.: US 12,243,857 B2
(45) Date of Patent: Mar. 4, 2025

(54) SEMICONDUCTOR INTEGRATED CIRCUIT

(71) Applicant: Mitsubishi Electric Corporation, Tokyo (JP)

(72) Inventor: Motoki Imanishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/044,744

(22) Filed: Jul. 25, 2018

(65) Prior Publication Data
US 2019/0096863 A1 Mar. 28, 2019

(30) Foreign Application Priority Data
Sep. 25, 2017 (JP) .................................. 2017-183234

(51) Int. Cl.
*H03K 17/691* (2006.01)
*H01L 25/16* (2023.01)
(Continued)

(52) U.S. Cl.
CPC ......... *H01L 25/162* (2013.01); *H03K 17/689* (2013.01); *H03K 17/691* (2013.01); *H04L 25/0266* (2013.01)

(58) Field of Classification Search
CPC ............. H03K 17/689; H03K 17/6895; H03K 17/691; H04L 25/0266; H04L 25/0268; H04L 25/027
See application file for complete search history.

(56) References Cited

U.S. PATENT DOCUMENTS 7,994,890 B2 * 8/2011 Edo .................. H03K 17/18
336/200
2007/0218595 A1 9/2007 Yoshimura
(Continued)

FOREIGN PATENT DOCUMENTS

JP 2007-252109 A 9/2007
JP 2010-116024 A 5/2010
(Continued)

OTHER PUBLICATIONS

An Office Action; "Notice of Reasons for Refusal," mailed by the Japanese Patent Office on Oct. 6, 2020, which corresponds to Japanese Patent Application No. 2017-183234 and is related to U.S. Appl. No. 16/044,744 with English language translation.
(Continued)

*Primary Examiner* — Patrick C Chen
(74) *Attorney, Agent, or Firm* — Studebaker Brackett PLLC

(57) ABSTRACT

Provided is a semiconductor integrated circuit that improves insulation reliability between a high-voltage circuit and a low-voltage circuit. The semiconductor integrated circuit includes the following: a first circuit controlled by a control signal of low voltage and driven at a higher voltage; a second circuit configured to output the control signal to the first circuit to control the driving of the first circuit; and a plurality of insulation circuits each including an insulating element, the plurality of insulation circuits connecting between the first and the second circuits in series. Each insulation circuit is configured to magnetically or capacitively couple the control signal in the insulating element to transmit it from the second circuit to the first circuit, and is configured to insulate the first circuit from the second circuit in the insulating element to prevent the higher voltage from being applied from the first circuit to the second circuit.

10 Claims, 5 Drawing Sheets

(51) Int. Cl.
*H03K 17/689* (2006.01)
*H04L 25/02* (2006.01)

(56) References Cited

U.S. PATENT DOCUMENTS

| | | | |
|---|---|---|---|
| 2008/0231340 A1* | 9/2008 | Shiraki | H03K 5/003 |
| | | | 327/333 |
| 2009/0101940 A1* | 4/2009 | Barrows | H03K 19/1778 |
| | | | 257/204 |
| 2009/0108815 A1* | 4/2009 | Overland | H02M 7/217 |
| | | | 320/166 |
| 2009/0273012 A1 | 11/2009 | Harris | |
| 2010/0072971 A1* | 3/2010 | Nuebling | H02M 1/08 |
| | | | 323/299 |
| 2011/0215639 A1 | 9/2011 | Kurosaki | |
| 2013/0055052 A1* | 2/2013 | Kaeriyama | H01L 25/162 |
| | | | 714/799 |
| 2013/0271187 A1 | 10/2013 | Hayashi et al. | |
| 2013/0321094 A1 | 12/2013 | Sumida et al. | |
| 2014/0049297 A1 | 2/2014 | Nagai et al. | |
| 2014/0077588 A1 | 3/2014 | Moribayashi | |
| 2014/0091854 A1* | 4/2014 | Murata | H03K 17/689 |
| | | | 327/436 |
| 2014/0347905 A1 | 11/2014 | Takizawa | |
| 2015/0171901 A1 | 6/2015 | Dupuis et al. | |
| 2015/0234417 A1 | 8/2015 | Kawai et al. | |
| 2016/0003887 A1 | 1/2016 | Nagase | |
| 2018/0013424 A1 | 1/2018 | Uchida et al. | |
| 2018/0294652 A1* | 10/2018 | Loefflad | H03K 17/133 |

FOREIGN PATENT DOCUMENTS

| | | |
|---|---|---|
| JP | 2013-051547 A | 3/2013 |
| JP | 2013-222978 A | 10/2013 |
| JP | 2014-060602 A | 4/2014 |
| JP | 2014-522561 A | 9/2014 |
| JP | 2014-230357 A | 12/2014 |
| JP | 2015-149731 A | 8/2015 |
| JP | 2016-015393 A | 1/2016 |
| WO | 2011/018835 A1 | 2/2011 |
| WO | 2012/096321 A1 | 7/2012 |
| WO | 2013/065254 A1 | 5/2013 |
| WO | 2015/029363 A1 | 3/2015 |
| WO | 2016/117410 A1 | 7/2016 |

OTHER PUBLICATIONS

An Office Action mailed by the Japanese Patent Office on Feb. 2, 2021, which corresponds to Japanese Patent Application No. 2017-183234 and is related to U.S. Appl. No. 16/044,744; with English language translation.

An Office Action; "Notice of Reasons for Refusal", mailed by the Japanese Patent Office on Mar. 8, 2022, which corresponds to Japanese Patent Application No. 2021-075845 and is related to U.S. Appl. No. 16/044,744; with English language translation.

"Notice of Reasons for Refusal" Office Action issued in JP 2021-075845; mailed by the Japanese Patent Office on Aug. 2, 2022.

* cited by examiner

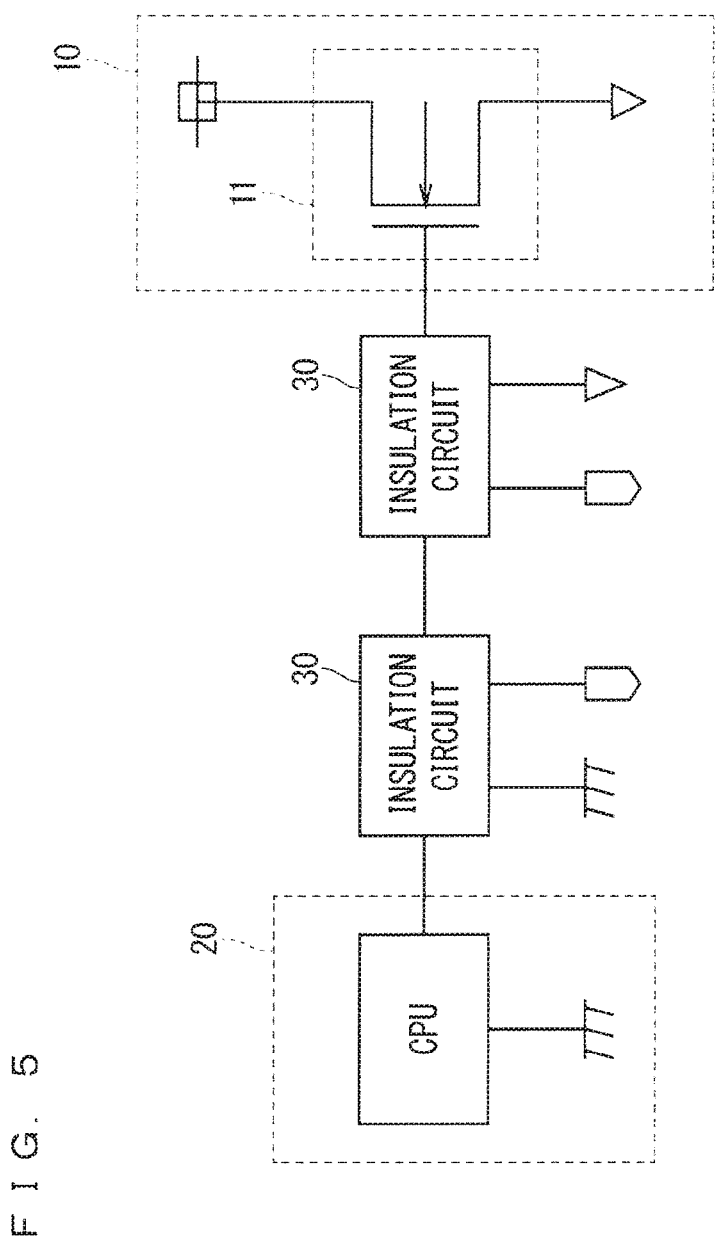

SEMICONDUCTOR INTEGRATED CIRCUIT

BACKGROUND OF THE INVENTION

Field of the Invention

The present invention relates to semiconductor integrated circuits.

Description of the Background Art

Insulation circuits (isolators) each have been conventionally interposed between a central processing unit (CPU) forming a control circuit positioned at a higher level of a system, and a semiconductor switching element driven at a high voltage in the system. For instance, Japanese Patent Application Laid-Open No. 2013-51547 discloses a semiconductor integrated circuit including an insulation circuit, such as a photocoupler or a digital isolator. The semiconductor integrated circuit transmits a signal while insulating a transmission circuit from a reception circuit.

The photocoupler or the digital isolator has an insulating portion composed of an organic compound. Applying a voltage equal to or greater than a dielectric strength across the insulating portion within the isolator produces an electrical breakdown to pass a short-circuit current through the insulating portion. The CPU, disposed at a higher level of the system, and the inside of the system to which a high voltage is applied are unfortunately no longer insulated from each other.

SUMMARY

It is an object of the Specification to provide a semiconductor integrated circuit that improves insulation reliability between a circuit driven at a high voltage and a circuit driven at a lower voltage than the high voltage.

An aspect of the Specification provides a semiconductor integrated circuit that includes the following: a first circuit controlled by a control signal of low voltage and driven at a higher voltage than the control signal of low voltage; a second circuit configured to output the control signal of low voltage to the first circuit to control the driving of the first circuit; and a plurality of insulation circuits each including an insulating element, the plurality of insulation circuits connecting between the first circuit and the second circuit in series. Each insulation circuit is configured to magnetically couple or capacitively couple the control signal in the insulating element to transmit the control signal from the second circuit to the first circuit, and is configured to insulate the first circuit from the second circuit in the insulating element to prevent the higher voltage from being applied from the first circuit to the second circuit.

The semiconductor integrated circuit according to the aspect of the Specification improves insulation reliability between a circuit driven at a high voltage and a circuit driven at a lower voltage than the high voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram of a configuration of a semiconductor integrated circuit according to a fifth preferred embodiment.

DESCRIPTION OF THE PREFERRED EMBODIMENTS

<First Preferred Embodiment>

Figure 1:
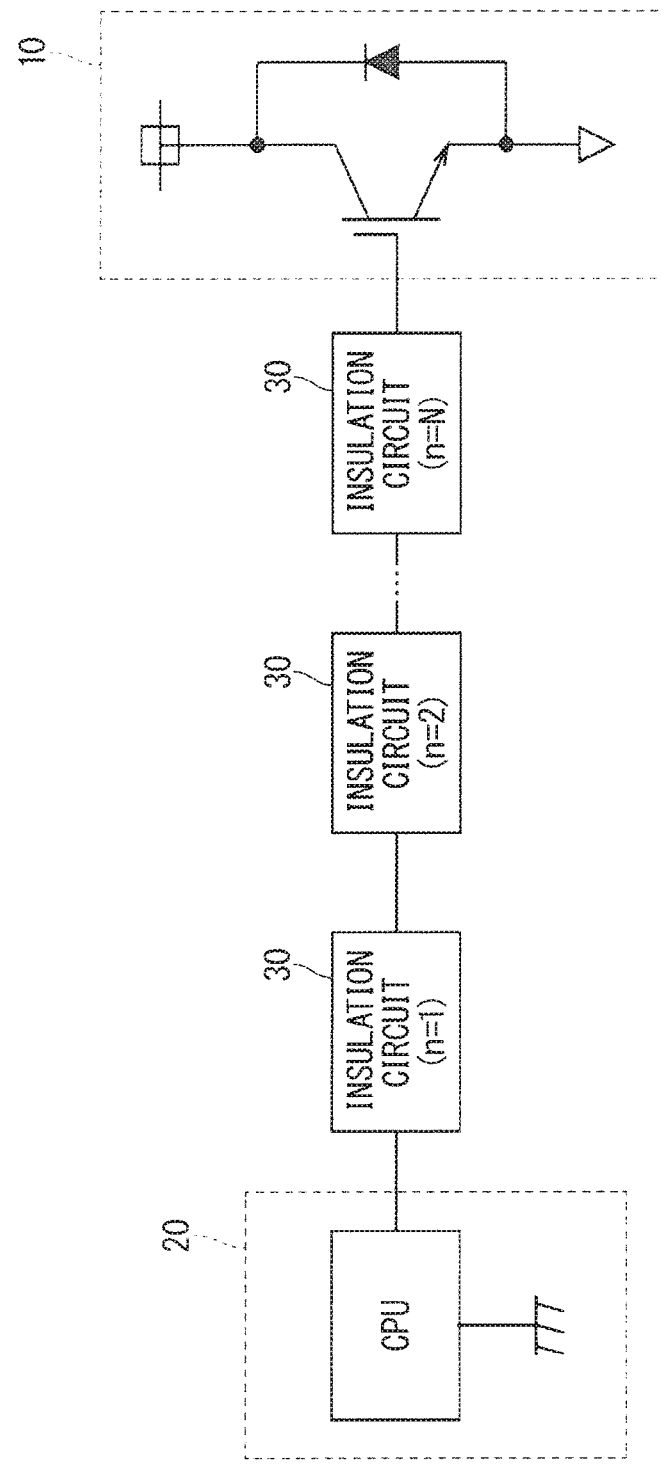
FIG. 1 is a diagram of a configuration of a semiconductor integrated circuit according to a first preferred embodiment.

The following describes a semiconductor integrated circuit according to a first preferred embodiment. FIG. 1 is a diagram of a configuration of the semiconductor integrated circuit according to the first preferred embodiment.

The semiconductor integrated circuit includes a first circuit 10, a second circuit 20, and a plurality of insulation circuits 30.

The first circuit 10 includes a switching element, and is disposed at a lower level of a system (not shown). The first circuit 10 receives a control signal of low voltage from the second circuit 20, and is driven at a higher voltage than the control signal of low voltage. The switching element outputs the high voltage in response to the reception of the control signal of low voltage for instance. In the first preferred embodiment, the switching element is a semiconductor device called a power semiconductor device to which the high voltage is applied.

The second circuit 20 is disposed at a higher level of the system, and is a CPU for instance. The second circuit 20 outputs the control signal of low voltage to the first circuit 10 to control the driving of the first circuit 10.

Each insulation circuit 30 connects between the first circuit 10 and the second circuit 20 in series. In the first preferred embodiment, N number of insulation circuits 30 ranging from n=1 to n=N are connected in series is a natural number equal to or greater than one).

Each insulation circuit 30 includes an insulating element, which is not shown in FIG. 1.

Each insulation circuit 30 magnetically couples or capacitively couples the control signal in the insulating element to transmit the control signal from the second circuit 20 to the first circuit 10. Further, the insulation circuit 30 insulates the first circuit 10 from the second circuit 20 in the insulating element to prevent the higher voltage from being applied from the first circuit 10 to the second circuit 20.

Even if an electrical breakdown is produced in the insulating element included in any of the insulation circuits, the semiconductor integrated circuit enables the remaining insulation circuits to securely insulate the first circuit 10 from the second circuit 20. Moreover, the semiconductor integrated circuit enables the system to which the high voltage is applied and components including the CPU driven at the lower voltage than the high voltage to be securely insulated from each other. That is, the semiconductor integrated circuit in the first preferred embodiment improves insulation reliability between the second circuit 20, driven at the high voltage, and the first circuit 10, driven at the lower voltage than the high voltage.

<Second Preferred Embodiment>

The following describes a semiconductor integrated circuit according to a second preferred embodiment. It is noted that similar components and similar operations between the first preferred embodiment and the second preferred embodiment will not be elaborated upon here.

Figure 2:
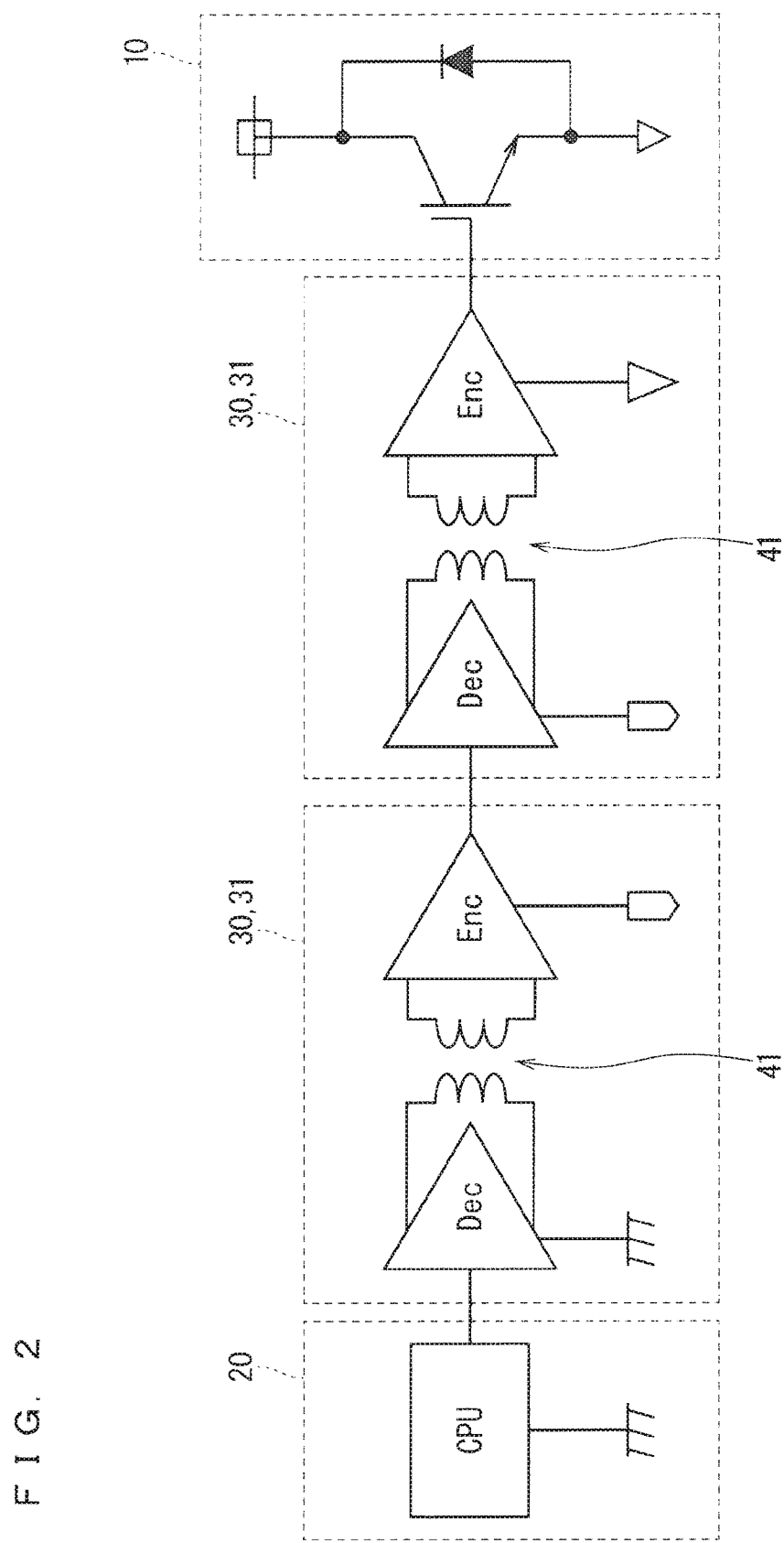
FIG. 2 is a diagram of a configuration of a semiconductor integrated circuit according to a second preferred embodiment.

FIG. 2 is a diagram of a configuration of the semiconductor integrated circuit according to the second preferred embodiment.

At least one of a plurality of insulation circuits 30 connecting between the first circuit 10 and the second circuit 20 in series includes a magnetic coupling element 41 as an insulating element. In the second preferred embodiment, two insulation circuits 31 connect between the first circuit 10 and the second circuit 20 in series. Each insulation circuit 31 is a digital isolator for instance. The magnetic coupling element 41 is a transformer for instance. The number of insulation circuits 31 for serial connection is not limited to two. N number of insulation circuits 31 may be connected in series.

Each insulation circuit 31 magnetically couples the control signal output from the second circuit 20 in the magnetic coupling element 41 to transmit the control signal to the first circuit 10.

A serial connection between insulation circuits can produce a delay in signal transmission in accordance with the number of insulation circuits as connected in series, However, in the semiconductor integrated circuit in the second preferred embodiment, the transformer that is the magnetic coupling element 41 operates at a very high frequency, and thus the delay in signal transmission is reduced.

<Third Preferred Embodiment>

The following describes a semiconductor integrated circuit according to a third preferred embodiment. It is noted that similar components and similar operations between the first or second preferred embodiment and the third preferred embodiment will not be elaborated upon here.

Figure 3:
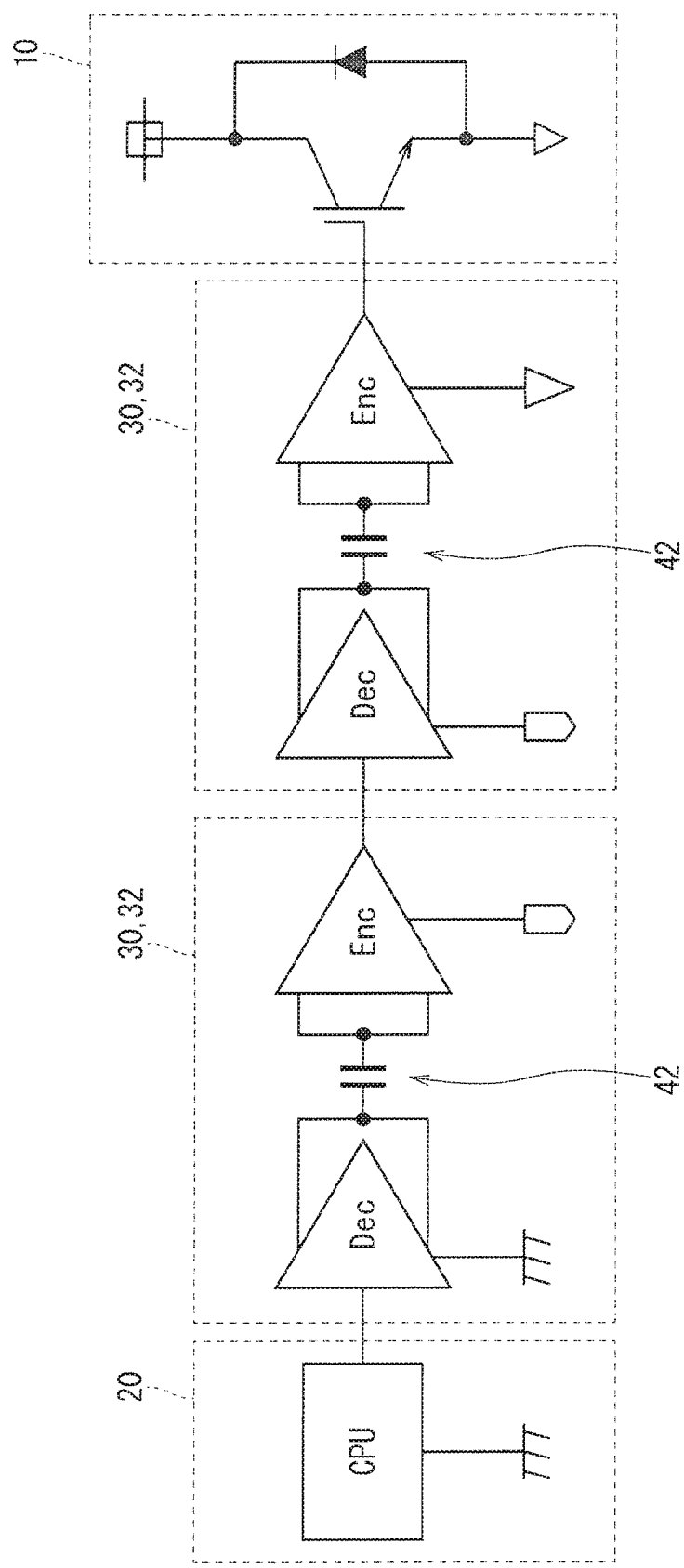
FIG. 3 is a diagram of a configuration of a semiconductor integrated circuit according to a third preferred embodiment.

FIG. 3 is a diagram of a configuration of the semiconductor integrated circuit according to the third preferred embodiment At least one of a plurality of insulation circuits 30 connecting between the first circuit 10 and the second circuit 20 in series includes a capacitive coupling element 42 as an insulating element. In the third preferred embodiment, two insulation circuits 32 connect between the first circuit 10 and the second circuit 20 in series. Each insulation circuit 32 is a digital isolator for instance. The capacitive coupling element 42 is a capacitor for instance. it is noted that the number of insulation circuits 32 for serial connection is not limited to two. N number of insulation circuits 32 may be connected in series.

Each insulation circuit 32 capacitively couples the control signal output from the second circuit 20 in the capacitive coupling element 42 to transmit the control signal to the first circuit 10.

In the semiconductor integrated circuit, a capacity forming the capacitive coupling element 42, e.g., the thickness of an insulating film facilitates the control of a dielectric strength.

<Fourth Preferred Embodiment>

The following describes a semiconductor integrated circuit according to a fourth preferred embodiment. It is noted that similar components and similar operations between any of the first to third preferred embodiments and the fourth preferred embodiment will not be elaborated upon here.

Figure 4:
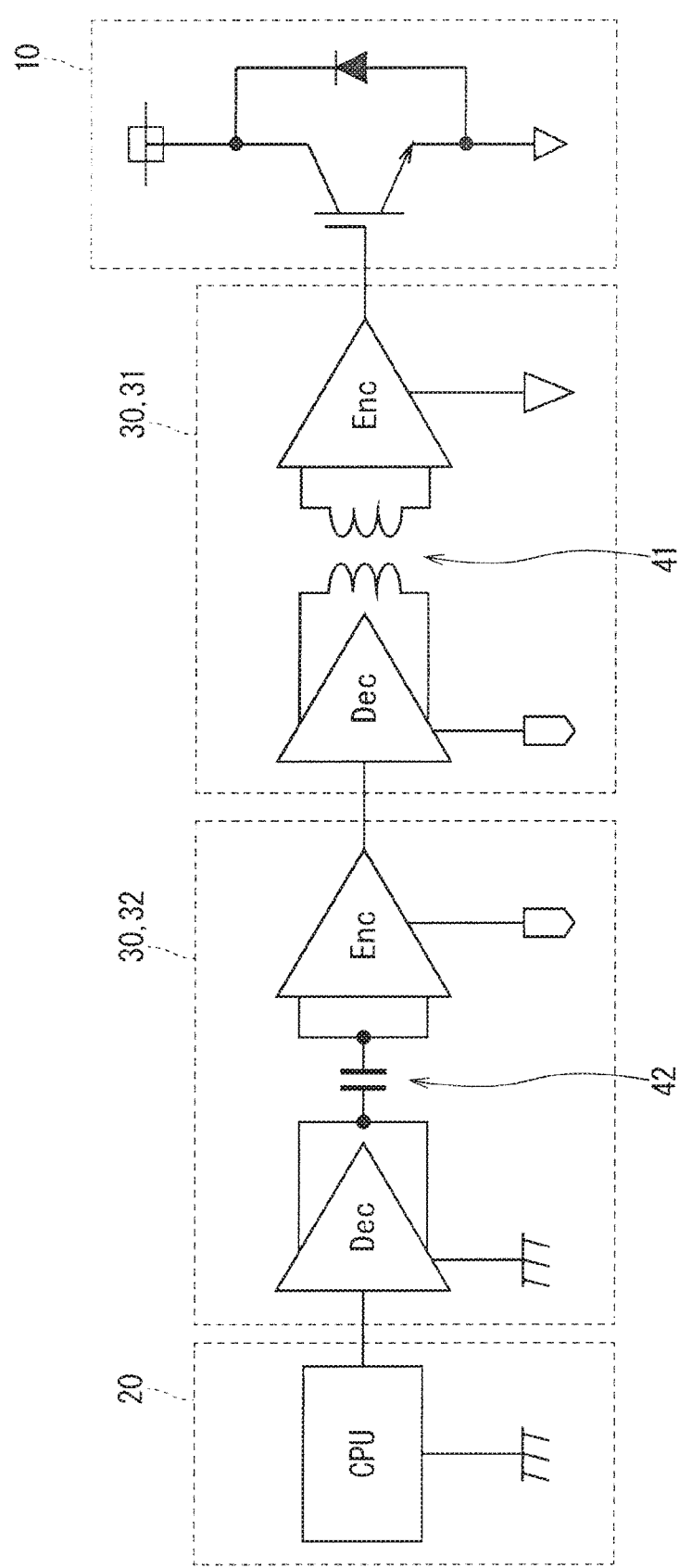
FIG. 4 is a diagram of a configuration of a semiconductor integrated circuit according to a fourth preferred embodiment.

FIG. 4 is a diagram of a configuration of the semiconductor integrated circuit according to the fourth preferred embodiment.

At least one of a plurality of insulation circuits 30 connecting between the first circuit 10 and the second circuit 20 in series includes the magnetic coupling element 41 as an insulating element. Moreover, at least another of the plurality of insulation circuits 30 includes the capacitive coupling element 42 as an insulating element. That is, the semiconductor integrated circuit includes a combination of an insulation circuit 31 including the magnetic coupling element 41 and an insulation circuit 32 including the capacitive coupling element 42.

A single insulation circuit 31 and a single insulation circuit 32 connect between the first circuit 10 and the second circuit 20 in series. It is noted that the number of insulation circuits 30 for serial connection is not limited to two. N number of insulation circuits 30 may be connected in series.

The insulation circuit 31 magnetically couples the control signal output from the second circuit 20 in the magnetic coupling element 41 to transmit the control signal to the first circuit 10. Moreover, the insulation circuit 32 capacitively couples the control signal in the capacitive coupling element 42 to transmit the control signal to the first circuit 10.

With such a configuration, the magnetic coupling element 41 prevents the increase or the generation of the delay in signal transmission. In addition, a transmission-and-reception mode of a transformer, which is the magnetic coupling element 41, facilitates the control of a common-mode transient immunity (CMTI) or noise tolerance. In addition, controlling the thickness of an insulating film of the capacitive coupling element 42 obtains a desired dielectric strength.

<Fifth Preferred Embodiment>

The following describes a semiconductor integrated circuit according to a fifth preferred embodiment. It is noted that similar components and similar operations between any of the first to fourth preferred embodiments and the fifth preferred embodiment will not be elaborated upon here.

FIG. 5 is a diagram of a configuration of the semiconductor integrated circuit according to the fifth preferred embodiment.

A first circuit 10 includes a switching element 11. The switching element 11 is a semiconductor device formed of a transistor containing SiC and called a power semiconductor device to which a high voltage is applied. Herein, the switching element 11 is a SiC metal-oxide-semiconductor field-effect transistor (MOSFET).

A second circuit 20 outputs the control signal to the switching element 11 to control the driving of the switching element 11 to control the driving of the first circuit 10.

A power semiconductor device, such as a SiC MOSFET provides high performance in an application requiring high-speed operation or an application requiring high strength. In the fifth preferred embodiment, the semiconductor integrated circuit includes a plurality of insulation circuits 30, such as digital isolators having high-insulation performance and high-speed performance. This improves a system level when the semiconductor integrated circuit controls the driving of the power semiconductor device.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit comprising:
a first circuit controlled by a control signal of low voltage and driven at a higher voltage than the control signal of low voltage, the first circuit including an insulated gate bipolar transistor (IGBT) that receives the control signal of low voltage at a gate electrode of the IGBT, so that the control signal directly controls whether the IGBT outputs the higher voltage;

a second circuit configured to output the control signal of low voltage to the first circuit to control driving of the first circuit;

at least one first insulation circuit that receives and outputs the control signal of low voltage from the second circuit; and a second insulation circuit that receives the control signal of low voltage from the at least one first insulation circuit and outputs the control signal of low voltage directly into the gate electrode of the IGBT of the first circuit, wherein each of the at least one first insulation circuit and the second insulation circuit includes an insulating element and is configured to magnetically couple or capacitively couple the control signal in the respective insulating element to transmit the control signal from the second circuit to the first circuit, and is configured to insulate the first circuit from the second circuit in the respective insulating element to prevent the higher voltage from being applied from the first circuit to the second circuit.

2. The semiconductor integrated circuit according to claim 1, wherein at least one of the insulation circuits includes, as the insulating element, a magnetic coupling element configured to magnetically couple the control signal.

3. The semiconductor integrated circuit according to claim 1, wherein at least one of the insulation circuits includes, as the insulating element, a capacitive coupling element configured to capacitively couple the control signal.

4. The semiconductor integrated circuit according to claim 1, wherein at least one of the insulation circuits includes, as the insulating element, a magnetic coupling element configured to magnetically couple the control signal, and at least another of the insulation circuits includes, as the insulating element, a capacitive coupling element configured to capacitively couple the control signal.

5. The semiconductor integrated circuit according to claim 1, wherein an output terminal of the second insulation circuit is connected to the gate electrode of the IGBT of the first circuit only through wiring.

6. The semiconductor integrated circuit according to claim 1, wherein the second circuit includes a CPU configured to output the control signal of low voltage.

7. The semiconductor integrated circuit according to claim 1, wherein each of the at least one first insulation circuit and the second insulation circuit includes a transmission circuit provided on a second circuit side with respect to the insulating element and configured to receive the control signal from the second circuit side to output the control signal to the insulating element side; and a reception circuit provided on a first circuit side with respect to the insulating element and configured to receive the control signal output from the transmission circuit to output the control signal to the first circuit side, and each of the at least one first insulation circuit and the second insulation circuit is configured to magnetically couple or capacitively couple the transmission circuit to the reception circuit at the respective insulating element to transmit the control signal from the second circuit to the first circuit.

8. The semiconductor integrated circuit according to claim 1, wherein each of the at least one first insulation circuit and the second insulation circuit is a digital isolator.

9. The semiconductor integrated circuit according to claim 1, wherein the at least one first insulation circuit and the second insulation circuit have the same structure.

10. The semiconductor integrated circuit according to claim 1, wherein the at least one first insulation circuit includes, as the insulating element, a capacitive coupling element, and the second insulation circuit includes, as the insulating element, a magnetic coupling element.

* * * * *